(12) United States Patent
Visokay

(10) Patent No.: US 6,380,080 B2
(45) Date of Patent: *Apr. 30, 2002

(54) METHODS FOR PREPARING RUTHENIUM METAL FILMS

(75) Inventor: Mark R. Visokay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/520,492

(22) Filed: Mar. 8, 2000

(51) Int. Cl.[7] .................. H01L 21/44; H01L 21/31; H01L 21/469; B05D 5/12; C23C 16/00

(52) U.S. Cl. .................. 438/681; 438/686; 438/778; 427/99; 427/255.28

(58) Field of Search .................. 438/681, 686, 438/758, 778; 427/99, 252, 255.28, 576, 584

(56) References Cited

U.S. PATENT DOCUMENTS

| 5,130,172 A | 7/1992 | Hicks et al. |
|---|---|---|
| 5,314,727 A | 5/1994 | McCormick et al. |
| 5,352,488 A | 10/1994 | Spencer et al. |
| 5,372,849 A | 12/1994 | McCormick et al. |
| 5,392,189 A | 2/1995 | Fazan et al. |
| 5,510,651 A | 4/1996 | Maniar et al. |
| 5,520,992 A | 5/1996 | Douglas et al. |
| 5,555,486 A | 9/1996 | Kingon et al. |
| 5,561,307 A | 10/1996 | Mihara et al. |
| 5,566,045 A | 10/1996 | Summerfelt et al. |
| 5,581,436 A | 12/1996 | Summerfelt et al. |
| 5,763,633 A | 6/1998 | Vaartstra |
| 5,874,364 A | 2/1999 | Nakabayashi et al. |
| 5,935,648 A | 8/1999 | Roberson et al. |
| 5,962,716 A | 10/1999 | Uhlenbrock et al. |
| 5,980,983 A | 11/1999 | Gordon |
| 6,063,705 A * | 5/2000 | Vaartstra et al. ............ 438/681 |
| 6,074,945 A * | 6/2000 | Vaartstra et al. ............ 438/681 |
| 6,114,557 A | 9/2000 | Uhlenbrock et al. |
| 6,133,159 A | 10/2000 | Vaartstra et al. |

FOREIGN PATENT DOCUMENTS

| WO | WO 00/12776 | 3/2000 |
|---|---|---|
| WO | WO 00/12779 | 3/2000 |

OTHER PUBLICATIONS

Anderson et al., "Caborane Complexes of Ruthenium: A Convenient Synthesis of [Ru(CO)$_3$($\eta^5$–7,8–C$_2$B$_9$H$_{11}$)] and a Study of Reactions Of This Complex," *Organometallics*, 14, 3516–3526 (1995). No Month.

(List continued on next page.)

*Primary Examiner*—Alexander G. Ghyka
(74) *Attorney, Agent, or Firm*—Mueting, Raasch & Gebhardt, P.A.

(57) ABSTRACT

The present invention provides methods for the preparation of ruthenium metal films from liquid ruthenium complexes of the formula (diene)Ru(CO)$_3$, wherein "diene" refers to linear, branched, or cyclic dienes, bicyclic dienes, tricyclic dienes, fluorinated derivatives thereof, combinations thereof, or derivatives thereof additionally containing heteroatoms such as halide, Si, S, Se, P, As, N, or O, in the presence of an oxidizing gas.

19 Claims, 2 Drawing Sheets

OTHER PUBLICATIONS

Aoyama et al., "Chemical Vapor Deposition of Ru and Its Application in (Ba,Sr)TiO$_3$ Capacitors for Future Dynamic Random Access Memories,"*Jpn. J. Appl. Phys.*, 38:2194–2199 (1999). No Month.

Bai et al., "Low–temperature growth and orientational control in RuO2 thin films by metal–organic chemical vapor deposition," *Thin Solid Film*, 310, 75–80 (1997). No Month.

Bennett et al., "Mono–olefin Chelate Complexes of Iron(0) and Ruthenium(0) with an Olefinic Tertiary Phosphjine," *J. Chem. Soc. D.*, 7, 341–342 (1971). No Month.

Cowles et al., "Relative Reactivity of Co–ordinated Ligands in the Dienyktricarbonyl–ruthenium Cation, [(dienyl)Ru(CO)$_3$]$^{3^0}$, " *Chemical Commun.*, 392 (1969). No Month.

Green et al., "Chemical Vapor Deposition of Ruthenium and Ruthenium Dioxide Films," *J. Electrochem. Soc.*, 132:2677–2684 (1985). No Month.

Igumenov, "MO CVD of Noble Metals," *J. De Physique IV*, 5, C5–489–C5–496 (1995). No Month.

Johnson et al., "Chemistry," *Nature*, 901–902 Mar. 4, 1967.

Kaesz et al., "Low–Temperature Organometallic Chemical Vapor Deposition of Transition Metals," *Mat. Res. Soc. Symp. Proc.*, 131, 395–400 (1989). No Month.

Liao et al., "Characterization of RuO$_2$ thin films deposited on Si by metal–organic chemical vapor deposition," *Thin Solid Films*, 287, 74–79 (1996). No Month.

Macchioni et al., "Cationic Bis– and Tris(η2–(pyrazol–1–y1)methane) Acetyl Complexes of Iron (II) and Ruthenium(II): Synthesis, Characterization, Reactivity, and Interionic Solution Structure by NOESY NMR Spectroscopy," *Organometallics*, 16, 2139–2145 (1997). No Month.

Nakmura et al., "Embedded DRAM Technology compatible to the 0.13$\mu$m high–speed Logics by using Ru pillars in cell capacitors and Peripherial vias," *IEEE*, (1998). No Month.

Park et al., "Metallorganic Chemical Vapor Deposition of Ru and RuO$_2$ Using Ruthenocene Precursor and Oxygen Gas," *J. Electrochem. Soc.*, 147:203–209 (2000). No Month.

Senzaki et al., Chemical Abstract 128:264103, *Proc. Electrochem. Soc.*, 97–25 (Chemical Vapor Deposition), 933–43 (1997). No Month.

Shin et al., "Characterization of RuO$_2$ Thin Films Prepared by Hot–Wall Metallorganic Chemical Vapor Deposition," *J. Electrochem. Soc.*, 144, 1055–1060 (1997). No Month.

Sosinsky et al., "Hydrocarbon Complexes of Ruthenium. Part IV. Cyclic Dienyl Complexes," *J. Chem. Soc.*, 16–17, 1633–1640 (1975). No Month.

Takagi et al., "RuO$_2$ Bottom Electrodes for Ferroelectric (Pb, La)(Zr, Ti)O$_3$ Thin Films by Metalorganic Chemical Vapor Deposition," *Jpn. J. Appl. Phys.*, 34, 4104–4107 (1995). No Month.

Versteeg et al., "Metalorganic Chemical Vapor Depostion By Pulsed Liquid Injection Using An Ultrasonic Nozzle: Titanium Dioxide on Sapphire from Titanium (IV) Isopropoxide," *Journal of American Ceramic Society*, 78:2763–2768 (1995). No Month.

Yuan et al., "Low–Temperature Chemical Vapor Deposition of Ruthenium Dioxide from Ruthenium Tetroxide: A Simple Approach to High–Purity RuO$_2$ Films," *Chem. Mater.*, 5, 908–910 (1993). No Month.

* cited by examiner

METHODS FOR PREPARING RUTHENIUM METAL FILMS

FIELD OF THE INVENTION

This invention relates to the preparation of ruthenium films using chemical vapor deposition and liquid ruthenium precursors.

BACKGROUND OF THE INVENTION

Films of metals, particularly ruthenium films, are becoming important for a variety of electronic and electrochemical applications. For example, ruthenium films are generally unreactive to silicon and metal oxides, and are good conductors. Films of ruthenium have suitable properties for a variety of uses in integrated circuits. For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors.

There are a wide variety of ruthenium compounds that can be used as precursors for the preparation of such films. Many are particularly well suited for use in chemical vapor deposition techniques. See, for example, U.S. Pat. No. 5,372,849 (McCormick et al.), which discloses the use of ruthenium compounds containing carbonyl ligands and other ligands. However, such compounds typically form dimers, which are less volatile and not as easily used in chemical vapor deposition techniques. Thus, there is a continuing need for methods for the preparation of ruthenium films using chemical vapor deposition techniques.

SUMMARY OF THE INVENTION

The present invention provides methods for the preparation of ruthenium metal films. In one embodiment, the method includes the steps of: providing a liquid precursor composition comprising one or more compounds of the formula (Formula I):

(diene)Ru(CO)$_3$ wherein: "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof; vaporizing the liquid precursor composition to form vaporized precursor composition; and directing the vaporized precursor composition in combination with one or more oxidizing gases toward the semiconductor substrate or substrate assembly to form a ruthenium metal film on a surface of the semiconductor substrate or substrate assembly. Preferably, the oxidizing gas is less oxidizing than oxygen (O$_2$). This method is particularly useful on complex structures, such as those containing one or more small high aspect ratio features (e.g., openings or post-type structures), which typically require excellent step coverage.

Complexes of Formula I suitable for use in the methods of the present invention are neutral complexes and are liquids at a temperature within a range of about 20° C. to about 50° C. They can be used in flash vaporization, bubbling, microdroplet formation techniques, etc., as neat liquids or in combination with an organic solvent. As used herein, "liquid" refers to a neat liquid (a liquid at room temperature or a solid at room temperature that melts at an elevated temperature up to about 50° C.), or a liquid or solid in a suitable organic solvent. Suitable organic solvents that could be used include hydrocarbons such as hexane, pentane, and toluene, for example.

Methods of the present invention are particularly well suited for forming films on a surface of a semiconductor substrate or substrate assembly, such as a silicon wafer, having high surface area topology, such as high aspect ratio openings formed therein, but such gaps are not required, used in forming integrated circuits. It is to be understood that methods of the present invention are not limited to deposition on silicon wafers; rather, other types of wafers (e.g., gallium arsenide wafer, etc.) can be used as well. Also, the methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

In one embodiment of the invention, a method of manufacturing a semiconductor structure, preferably having a surface with one or more small high aspect ratio features therein is provided. The method includes the steps of:

providing a semiconductor substrate or substrate assembly, which is exposed to a heater preferably set at a temperature of about 150° C. to about 350° C. (more preferably, at a temperature of about 200° C. to about 250° C.), and contained within a reaction chamber preferably having a pressure of about 10$^{-3}$ torr to about 1 atmosphere (more preferably, having a pressure of about 0.1 torr to about 10 torr);

providing a liquid precursor composition preferably at a temperature of about 20° C. to about 50° C., the precursor composition comprising one or more compounds of Formula I; vaporizing the liquid precursor composition to form vaporized precursor composition; and directing the vaporized precursor composition in combination with one or more oxidizing gases toward the semiconductor substrate or substrate assembly to form a ruthenium metal film on the surface of the semiconductor substrate or substrate assembly having the one or more small high aspect ratio features. Preferably, the oxidizing gas is less oxidizing than oxygen (O$_2$).

DETAILED DESCRIPTION OF PREFERRED EMBODIMENTS

Figure 1:
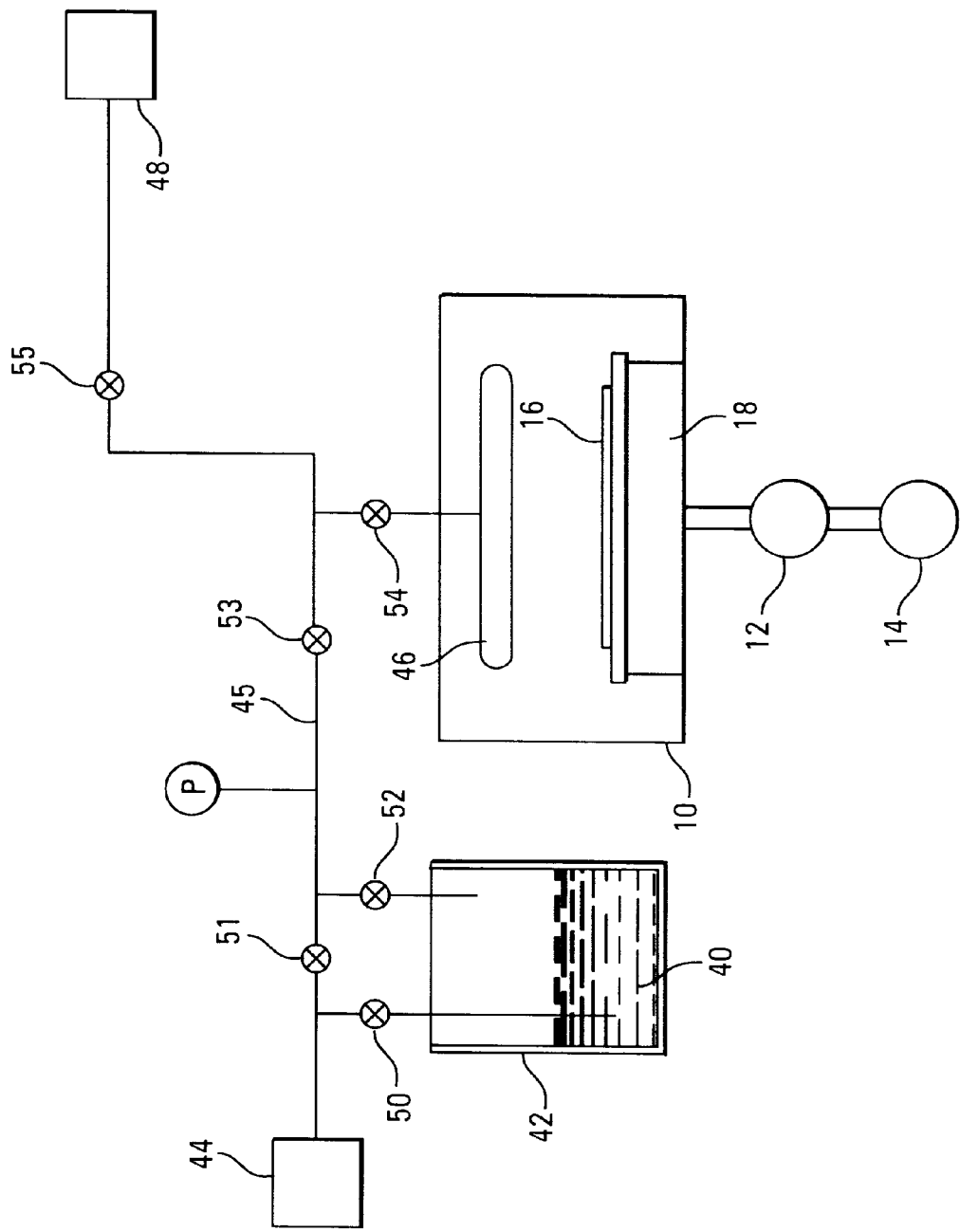
FIG. 1 is a schematic of a chemical vapor deposition system suitable for use in the method of the present invention.

The present invention provides methods of forming a ruthenium metal film using a vaporization technique (e.g., a chemical vapor deposition technique) and one or more liquid ruthenium complexes. Specifically, the present invention is directed to methods of manufacturing a semiconductor device having a ruthenium metal film thereon.

The liquid ruthenium complexes are of the following formula (Formula I):

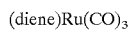

(diene)Ru(CO)$_3$ wherein: "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof. Preferably, the diene ligands include about 5 to about 8 carbon atoms, and more preferably, about 6 to about 7 carbon atoms. These precursor complexes are described in U.S. Pat. No. 6,063,705. They can be prepared according to methods described therein or according to methods described in U.S. Pat. No. 5,962,716.

Complexes of Formula I that are suitable for use in the present invention are neutral complexes and are liquids at room temperature or are solids at room temperature that melt at an elevated temperature up to about 50° C. These complexes are suitable for use in vaporization techniques (e.g., chemical vapor deposition (CVD) techniques), such as flash vaporization techniques, bubbler techniques, and/or microdroplet techniques, optionally in combination with an organic solvent. Preferred embodiments of the complexes described herein are particularly suitable for low temperature CVD, e.g., deposition techniques involving substrate temperatures of about 100° C. to about 400° C.

A preferred class of complexes include those that have a vapor pressure of greater than 0.1 torr at 50° C. Examples of such compounds include (cyclohexadiene)Ru(CO)$_3$ and (cycloheptadiene)Ru(CO)$_3$.

Preferably, the precursor composition is vaporized in the presence of, and reacted with, one or more oxidizing gases less aggressive (i.e., less oxidizing than) than O$_2$, and optionally one or more inert gases to form a ruthenium metal film. The inert gas, which can be a carrier gas, is typically selected from the group consisting of nitrogen, helium, argon, and mixtures thereof. In the context of the present invention, an inert gas is one that is generally unreactive with the complexes described herein and does not interfere with the formation of a ruthenium metal film. The oxidizing gases are reactive with the complexes described herein, at least at a surface under the conditions of chemical vapor deposition. Examples of oxidizing gases suitable for preparing a ruthenium metal film include N$_2$O, NO, CO$_2$, CO, H$_2$O$_2$, and H$_2$O. Preferably, the oxidizing gas is N$_2$O, CO, CO$_2$, or H$_2$O, and more preferably it is N$_2$O. Various combinations of oxidizing gases and optional inert gases can be used in the methods of the present invention to form films.

According to the literature, Ru metal deposition typically requires O$_2$ in the process in order to decompose the precursor. Depending upon the amount of O$_2$ used, Ru metal or RuO$_x$ films can be obtained. For the complexes described herein, even a small amount of O$_2$ leads to oxygen incorporation in the film and a significant modification of the morphology.

A less aggressive oxidizer, particularly N$_2$O, has several advantages: the deposition rate is significantly higher than can be achieved with no oxidizer (a method that is disclosed in U.S. Pat. No. 6,074,945; within-wafer uniformity is surprisingly and significantly better than can be achieved with no oxidizer; adhesion is better than for a ruthenium metal film formed with no oxidizer; and for films of comparable thickness, the resistivity of the ruthenium metal film deposited using N$_2$O is lower than for a film deposited using no oxidizer. The surface morphology, and morphology evolution with annealing, are comparable between the two processes. Also, crystallinity of the as-deposited and annealed films is similar for the two processes.

Methods of the present invention are particularly well suited for forming highly pure ruthenium metal films (preferably, at least about 95 atom-% pure, based on X-ray Photoelectron Spectroscopy (XPS), Auger Spectroscopy, or other methods) on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. A variety of structures could also have the ruthenium metal films deposited thereon. For example, posts (studs) or trenches (vias) could have the ruthenium metal films of the present invention deposited on or in.

Methods of the present invention are particularly useful for depositing highly pure ruthenium metal films on the surface of a semiconductor substrate or substrate assembly, such as a silicon wafer, having a high surface area topology, such as a surface (e.g., of an insulation layer) having high aspect ratio features, such as openings (i.e., gaps) or posts (i.e., studs), formed therein or thereon. Small high aspect ratio features typically have feature sizes or critical dimensions below about 1 micron (e.g., the diameter or width of an opening is less than about 1 micron), and more typically, about 0.3 micron to about 1 micron, and aspect ratios greater than about 1. Such aspect ratios are applicable to contact holes, vias, trenches, and a variety of other configurations. For example, a trench having an opening of 1 micron and a depth of 3 microns has an aspect ratio of 3. The present invention can be used for forming diffusion barrier layers in small high aspect ratio features due to the use of CVD processes for forming conformal ruthenium oxide diffusion barrier layers over step structures. Typically, using methods of the present invention greater than about 80% step coverage can be achieved. This refers to the ratio of the thickness of the layer deposited on the bottom surface to that on the top surface. The ruthenium metal films are particularly suitable for forming electrodes, such as in DRAM capacitors.

The ruthenium metal film is deposited upon decomposition (typically, thermal decomposition) of one or more complexes of Formula I. Methods of the present invention can utilize various vaporization techniques, such as flash vaporization, bubbling, etc., optionally photo- or plasma-assisted (although photo- and plasma-assisted depositions do not typically provide good step coverage). Examples of suitable CVD processes are generally discussed in U.S. Pat. No. 6,063,705, as well as in U.S. Pat. No. 5,372,849 (McCormick et al.), for example.

A typical chemical vapor deposition (CVD) system that can be used to perform a process of the present invention is shown in FIG. 1. The system includes an enclosed chemical vapor deposition chamber 10, which may be a cold wall-type CVD reactor. Reduced pressure may be created in chamber 10 using turbo pump 12 and backing pump 14. Preferably, the chamber pressure during deposition is about 10$^{-3}$ torr to about atmospheric pressure, and most preferably, it is about 0.1 torr to about 10 torr. The pressure is chosen such that it produces good step coverage and deposition rates.

One or more substrates 16 (e.g., semiconductor substrates or substrate assemblies) are positioned in chamber 10. A constant nominal temperature is established for the substrate, preferably at a temperature of about 150° C. to about 350° C. For optimum step coverage, deposition rate, and formation of a film, the most preferred substrate temperature is about 200° C. to about 250° C. Substrate 16 may be heated, for example, by an electrical resistance heater 18 on which substrate 16 is mounted. Other known methods of heating the substrate may also be utilized. For plasma- and photo-assisted CVD processes, however, the temperature of the substrate may be significantly lower.

In this process, the precursor composition 40, which contains one or more complexes of Formula I, is stored in liquid form (a neat liquid at room temperature or at an elevated temperature if solid at room temperature, or in an organic solvent) in vessel 42. The temperature of the liquid precursor composition is preferably about 20° C. to about 50° C. The pressure within vessel 42 is typically similar to that within chamber 10. A source 44 of a suitable inert gas is pumped into vessel 42 and bubbled through the precursor composition 40 picking up the precursor composition and carrying it into chamber 10 through line 45 and gas distributor 46. Additional inert gas or reaction gas may be supplied from source 48 as needed to provide the desired concentration of precursor composition and regulate the uniformity of the deposition across the surface of substrate 16. As shown, valves 50–55 are opened and closed as required. The reaction and optional inert (e.g., carrier) gases can be preheated if desired.

Generally, the precursor composition is carried into the CVD chamber 10 at a flow rate of the carrier gas of about 0 sccm (standard cubic centimeters) to about 1000 sccm, and preferably, at a flow rate of about 300 sccm to about 800 sccm. Typically, for flash vaporization a carrier gas is not required, although it is often used. A reaction gas (preferably, an oxidizing gas such as $N_2O$) is typically introduced into the CVD chamber 10 at a flow rate of about 10 sccm to about 1000 sccm, and preferably, at a flow rate of about 300 sccm to about 800 sccm. The semiconductor substrate is exposed to the precursor composition at a pressure of about 0.1 torr to about 10 torr for a time of about 10 seconds to about 30 minutes depending on the desired thickness. In chamber 10, the precursor composition will form an adsorbed layer on the surface of the substrate 16. As the deposition rate is temperature dependent, increasing the temperature of the substrate will typically increase the rate of deposition. However, if step coverage is required, higher temperatures may become detrimental. Thus, a substrate temperature is chosen to balance these two properties. Typically, desirable deposition rates are about 50 Angstroms/minute to about 1000 Angstroms/minute. The carrier gas containing the precursor composition is terminated by closing valve 53.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The complexes of Formula I are also particularly well suited for use with vapor deposition systems, as described in U.S. Pat. No. 6,244,575. Generally, one method described therein involves the vaporization of a precursor composition in liquid form. In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid optionally dissolved in a liquid medium) and provides reasonable deposition rates, particularly in device applications with small dimensions.

Various combinations of inert (e.g., carrier) gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to FIG. 1, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

After deposition, the film can be further annealed to densify it if desired. This can be done in the CVD reaction chamber or not. To crystallize and/or density a film, preferably, the annealing process is carried out in an inert gas, as described above for the carrier gases. To further oxidize a film, preferably, the annealing process is carried out in an oxidizing gas. Preferably, the pressure of this post annealing process is about 0.5 torr to about 5 atmospheres. Preferably, the substrate temperature of this post annealing process is about 300° C. to about 1000° C., and more preferably, about 500° C. to about 800° C.

The use of the complexes and methods of forming films of the present invention are beneficial for a wide variety of thin film applications in semiconductor structures, particularly those requiring diffusion barriers. For example, such applications include capacitors and metallization layers, such as multilevel interconnects in an integrated circuit structure. Such structures are described, for example, in U.S. Pat. No. 6,197,628.

The following examples are offered to further illustrate the various specific and preferred embodiments and techniques. It should be understood, however, that many variations and modifications may be made while remaining within the scope of the present invention.

EXAMPLE 1

Ruthenium Metal Film Deposition Using $(C_6H_8)Ru(CO)_3$

The pale yellow precursor, $(C_6H_8)Ru(CO)_3$, was added to a bubbler equipped with a dip tube and exit valve. The bubbler was connected to a CVD reactor. The bubbler was further connected to helium carrier gas introduced through a mass flow controller into the dip tube port of the bubbler. The bubbler was heated to about 26° C. and all downstream connections to the chamber were heated to about 50° C. A silicon wafer having a layer of BPSG thereon was placed on a heated chuck inside the CVD reactor. Ruthenium deposition was carried out by heating the wafer to 210° C. (as measured by a thermocouple in contact with the heated chuck) and establishing a chamber pressure of 5 torr using a helium carrier flow of 500 sccm, an argon flow of 500 sccm, and an additional flow of $N_2O$ (plumbed separately to the precursor delivery line) at 500 sccm. The helium carrier flow was diverted through the precursor bubbler for 180 seconds yielding a film that was later measured by spectroscopic ellipsometry to be about 440 Angstroms thick. This corresponds to a deposition rate of about 147 Angstroms/minute.

This same process was carried out as a comparison but without the $N_2O$ flow and with Argon flow of 200 sccm. In this case a deposition time of 350 seconds yielded ruthenium films about 420 Angstroms thick, for a deposition rate of about 72 Angstroms/minute. Representative process results for these two experiments are shown in Table 1 for films of comparable thickness.

TABLE 1

Characteristic Data for Ru films on BPSG Deposited Using $N_2O$ or No Oxidizer

| Process | Dep Time (sec) | Thickness (Å) | Thickness NU (%) | Rs mean (ohm/sq) | Rs NU (%) | Resistivity ($\mu$ohm cm) |
|---|---|---|---|---|---|---|
| No Ox | 350 | 421.5 | 14.7 | 32.8 | 12.2 | 138 |
| No Ox | 350 | 409.7 | 12.0 | 33.2 | 12.4 | 136 |
| No Ox | 350 | 419.4 | 11.9 | 32.5 | 11.2 | 136 |
| $N_2O$ | 180 | 438.1 | 5.1 | 24.7 | 5.6 | 108 |
| $N_2O$ | 180 | 438.8 | 5.2 | 24.7 | 5.5 | 108 |
| $N_2O$ | 180 | 438.5 | 4.8 | 24.6 | 5.2 | 108 |

"Thickness" and "Rs mean"=average of thickness and sheet resistance measurements, respectively, taken at thirteen (thickness) or nine (sheet resistance) sites across the wafer.

"Thickness NU" and "Rs NU"=standard deviation of the thirteen (thickness) or nine (sheet resistance) measurements (nonuniformity in the thickness and sheet resistance).

Figure 2:
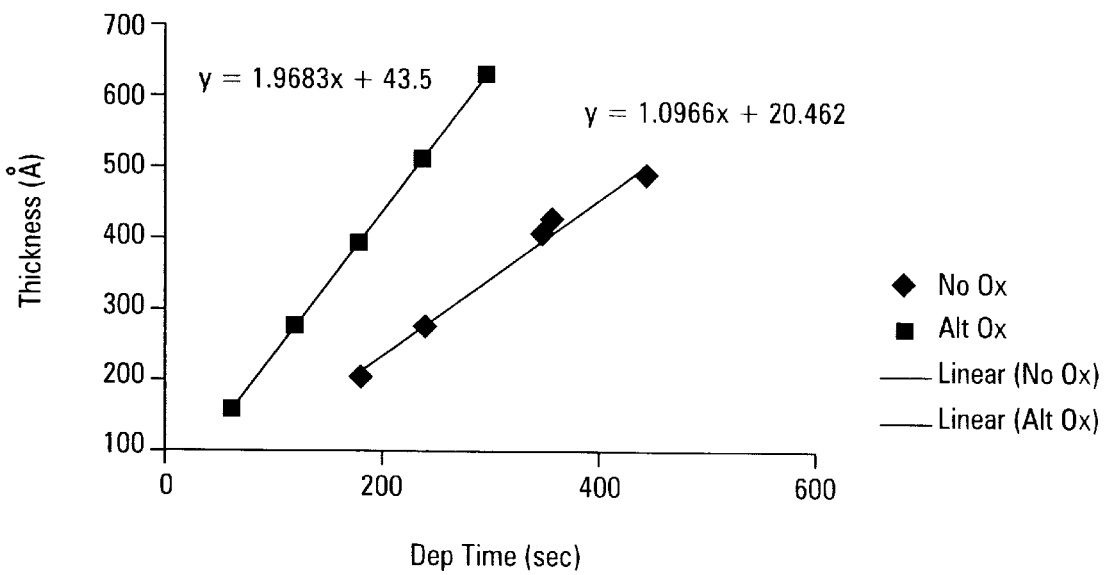
FIG. 2 is a graph that shows thickness of films versus deposition times for a process of the present invention with N$_2$O compared to no oxidizer ("No OX"=no oxidizer used in deposition process; "Alt Ox"=N$_2$O used in deposition process).

In both cases, the film was thin around the edge of the wafer, thick in the center. The degree of nonuniformity was significantly decreased for the process of the present invention (with $N_2O$), however. The deposition rate for the $N_2O$ process was significantly higher than for the process with no oxidizer, as can be seen from the data in Table 1 as well as in FIG. 2 which shows deposition time series for each process.

Figure 3:
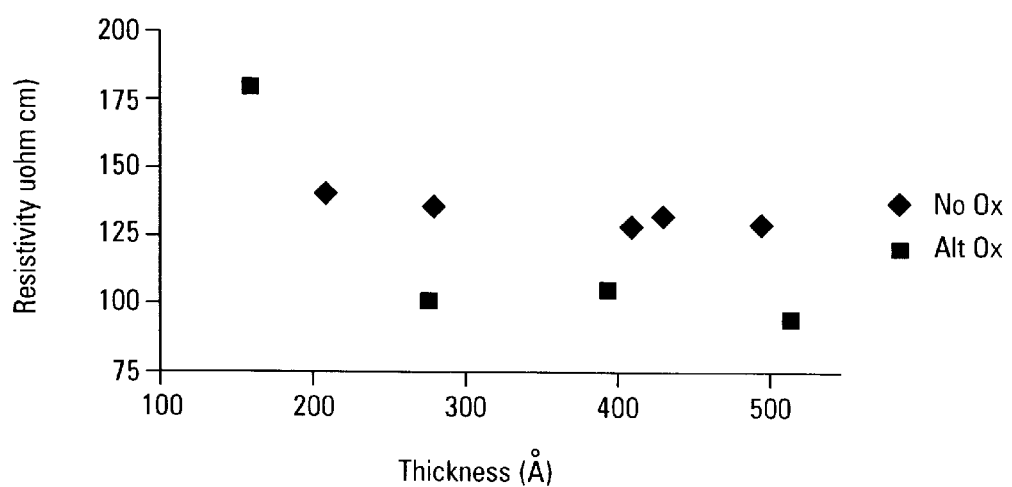
FIG. 3 is a graph that shows the thickness dependence of the resistivity for two films prepared using a process of the present invention with N$_2$O compared or no oxidizer ("No OX"=no oxidizer used in deposition process; "Alt Ox"=N$_2$O used in deposition process).

The film resistivity was somewhat lower for the $N_2O$ process, as shown in Table 1 as well as FIG. 3, which shows the thickness dependence of the resistivity for the two films. As-deposited, the films were only partially crystalline, so the resistivity was higher than would be expected for a crystalline film.

Surface morphology and morphology evolution of films deposited using the $N_2O$ process were examined by SEM. Deposition onto BPSG yielded films with good morphology as-deposited and after anneal. Deposition onto a clean Si surface, however, yielded poor nucleation and resulting morphology.

As-deposited and annealed samples were examined using Auger depth profiles. No oxygen was observed in the film, within the detection limits of the technique (approximately 0.1 atomic-%). No appreciable interdiffusion of the ruthenium and BPSG was detected. This indicates oxygen within the film will not be an issue in terms of oxidation of underlying layers during thermal treatments in the process flow.

EXAMPLE 2

Chemical Effect of $N_2O$

As shown above, the film deposition characteristics were quite different between the two processes. In order to establish the effect of the $N_2O$ on the deposition, several tests were run with varying process gases. In one case, $N_2$ was directly substituted for the $N_2O$, and in the other case the $N_2O$ flow was reduced to 100 sccm. The results of these depositions are shown in Table 2, along with data for the other two primary processes. Film thickness was not made constant for these depositions, but several points can be seen. Replacing the $N_2O$ with $N_2$ yielded a process very similar to the process with no oxidizer ("No Ox"). A chemical rather than dilution argument is supported here since the partial pressure of the carrier gas was the same for the two recipes. Similar nonuniformity, deposition rate and resistivities were observed. Reducing the $N_2O$ flow to 100 sccm yielded a lower deposition rate compared to the 500 scccm $N_2O$ process, but still higher than when no oxidizer is used.

TABLE 2

Deposition Process and Film Property Data for Ru Metal Films

| Process | "Extra" process gas | "Extra" gas flow (sccm) | Thickness mean (Å) | Thickness NU (%) | Dep. rate (Å/sec) | Carrier gas partial pressure (Torr) | Rs mean (ohm/sq) | Rs NU (%) | Resistivity (micro − ohm cm) |
|---|---|---|---|---|---|---|---|---|---|
| Alt Ox | $N_2O$ | 500 | 398 | 2.8 | 2.2 | 1.67 | 26.8 | 3.9 | 107 |
| Altox 2 | $N_2O$ | 100 | 289.1 | 6.3 | 1.6 | 2.3 | 40.1 | 8.7 | 116 |
| Altox 3 | $N_2$ | 500 | 218.3 | 5.0 | 1.21 | 1.67 | 61.2 | 8.0 | 134 |
| No Ox | None | 0 | 229.6 | 6.6 | 1.27 | 3.57 | 59.7 | 10.0 | 137 |

All patents, patent applications, and publications are herein incorporated by reference in their entirety, as if each were individually incorporated. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of manufacturing a semiconductor structure, the method comprising:
   providing a semiconductor substrate or substrate assembly;
   providing a liquid precursor composition comprising one or more compounds of the formula (Formula 1):

(diene)Ru(CO)$_3$ wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas less oxidizing than O$_2$ toward the semiconductor substrate or substrate assembly to form a ruthenium metal film on a surface of the semiconductor substrate or substrate assembly.

2. The method of claim 1 wherein the substrate or substrate assembly is contained within a reaction chamber having a pressure of about $10^{-3}$ torr to about 1 atmosphere.

3. The method of claim 2 wherein the substrate or substrate assembly is contained within a reaction chamber having a pressure of about 0.1 torr to about 10 torr.

4. The method of claim 1 wherein the substrate or substrate assembly is contained within a reaction chamber having a pressure of about 0.1 torr to about 10 torr.

5. The method of claim 1 wherein the step of vaporizing the liquid precursor comprises using a technique selected from the group of flash vaporization, bubbling, microdroplet formation, and combinations thereof.

6. The method of claim 1 wherein the semiconductor substrate or substrate assembly comprises a silicon wafer.

7. The method of claim 1 wherein the precursor composition is vaporized in the presence of at least one inert gas.

8. The method of claim 1 wherein the oxidizing gas is selected from the group of N$_2$O, NO, CO, CO$_2$, H$_2$O$_2$, H$_2$O, and combinations thereof.

9. The method of claim 8 wherein the oxidizing gas is selected from the group of N$_2$O, CO, CO$_2$, H$_2$O, and combinations thereof.

10. The method of claim 9 wherein the oxidizing gas is N$_2$O.

11. The method of claim 1 wherein the liquid precursor composition comprises an organic solvent.

12. A method of manufacturing a semiconductor structure, the method comprising:

providing a semiconductor substrate or substrate assembly, which is at a temperature of about 130° C. to about 300° C., contained within a reaction chamber having a pressure of about $10^{-3}$ torr to about 1 atmosphere;

providing a liquid precursor composition at a temperature of about 20° C. to about 50° C., the precursor composition comprising one or more compounds of the formula (Formula I):

(diene)Ru(CO)$_3$ wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas less oxidizing than O$_2$ toward the semiconductor substrate or substrate assembly to form a ruthenium metal film on a surface of the semiconductor substrate or substrate assembly.

13. A method of manufacturing a semiconductor structure, the method comprising:

providing a semiconductor substrate or substrate assembly;

providing a liquid precursor composition comprising one or more compounds of the formula (Formula I):

(diene)Ru(CO)$_3$ wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition;

directing the vaporized precursor composition in combination with at least one oxidizing gas less oxidizing than O$_2$ toward the semiconductor substrate or substrate assembly to form a ruthenium metal film on a surface of the semiconductor substrate or substrate assembly; and annealing the ruthenium metal film.

14. The method of claim 13 wherein the annealing step is carried out at a temperature of about 300° C. to about 1000° C.

15. A method of manufacturing a semiconductor structure, the method comprising:

providing a semiconductor substrate or substrate assembly comprising a surface having one or more small high aspect ratio features;

providing a liquid precursor composition comprising one or more compounds of the formula (Formula I):

(diene)Ru(CO)$_3$ wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas less oxidizing than O$_2$ toward the semiconductor substrate or substrate assembly to form a ruthenium metal film on the surface of the semiconductor substrate or substrate assembly having the one or more high aspect ratio features.

16. A method of forming a ruthenium metal film on a substrate, the method comprising:

providing a substrate;

providing a liquid precursor composition comprising one or more compounds of the formula (Formula I):

(diene)Ru(CO)$_3$ wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas less oxidizing than $O_2$ toward the substrate to form a ruthenium metal film on a surface of the substrate.

17. A method of manufacturing a semiconductor structure, the method comprising:

providing a semiconductor substrate or substrate assembly comprising a surface having one or more small high aspect ratio features, which is at a temperature of about 150° C. to about 350° C., wherein the semiconductor substrate or substrate assembly is contained within a reaction chamber having a pressure of about $10^{-3}$ torr to about 1 atmosphere;

providing a liquid precursor composition at a temperature of about 20° C. to about 50° C., the precursor composition comprising one or more compounds of the formula (Formula I):

$$(diene)Ru(CO)_3$$

wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas less oxidizing than $O_2$ toward the semiconductor substrate or substrate assembly to form a ruthenium metal film on the surface of the semiconductor substrate or substrate assembly having the one or more small high aspect ratio features.

18. A method of manufacturing a semiconductor structure, the method comprising:

providing a semiconductor substrate or substrate assembly;

providing a liquid precursor composition comprising one or more compounds of the formula (Formula I):

$$(diene)Ru(CO)_3$$

wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas toward the semiconductor substrate or substrate assembly to form at least about a 95 atom-% pure ruthenium metal film on a surface of the semiconductor substrate or substrate assembly.

19. A method of forming a ruthenium metal film on a substrate, the method comprising:

providing a substrate;

providing a liquid precursor composition comprising one or more compounds of the formula (Formula I):

$$(diene)Ru(CO)_3$$

wherein "diene" refers to linear, branched, or cyclic dienes, bicyclic dienes, tricyclic dienes, fluorinated derivatives thereof, derivatives thereof additionally containing heteroatoms such as halide, Si, S, Se, P, As, N, or O, or combinations thereof;

vaporizing the liquid precursor composition to form vaporized precursor composition; and directing the vaporized precursor composition in combination with at least one oxidizing gas toward the substrate to form at least about a 95 atom-% pure ruthenium metal film on a surface of the substrate.

* * * * *

UNITED STATES PATENT AND TRADEMARK OFFICE
CERTIFICATE OF CORRECTION

PATENT NO. : 6,380,080 B2
DATED : April 30, 2002
INVENTOR(S) : Visokay

Page 1 of 1

It is certified that error appears in the above-identified patent and that said Letters Patent is hereby corrected as shown below:

<u>Title page,</u>
Item [56], References Cited, OTHER PUBLICATIONS, in the "Aoyama et al." reference, please insert a space before "*Jpn.*";

In the "Bennett et al." reference, please delete "Phosphjine," and insert -- Phosphine --;

In the "Cowles et al." reference, please delete "Dienyktricarbonyl" and insert -- Dienyltricarbonyl --; and please delete "$Ru(CO)_3]^{30}$" and insert -- $Ru(CO)_3]^+$ --;

In the "Nakmura et al." reference, delete "Nakmura" and insert -- Nakamura --;

In the "Nakamura et al." reference, delete "Peripherial" and insert -- peripherial --; and <u>Column 1,</u>
Line 47, please delete "; vaporizing the liquid precursor composition to form vaporized precursor composition; and directing the vaporized precursor composition in combination with one or more oxidizing gasses toward the semiconductor substrate or substrate assembly to form a ruthenium metal film on a surface of the semiconductor substrate or substrate assembly. Preferably, the oxidizing gas is less oxidizing then oxygen ($O_2$). This method is particularly useful on complex structures, such as those containing one or more small high aspect ratio features (e.g., openings or post-type structures), which typically require excellent step coverage", and insert -- Preferably, the diene ligands include about 5 to about 8 carbon atoms, and more preferably, about 6 to about 7 carbon atoms. These precursor complexes are described in U.S. Pat. No. 5,962,716. --.

Signed and Sealed this

Fourteenth Day of September, 2004

JON W. DUDAS
*Director of the United States Patent and Trademark Office*